United States Patent [19]

Hong et al.

[11] Patent Number: 5,498,556
[45] Date of Patent: Mar. 12, 1996

[54] METAL-OXIDE-SEMICONDUCTOR FIELD-EFFECT TRANSISTOR AND ITS METHOD OF FABRICATION

[75] Inventors: Gary Hong, Hsinchu; Chen-Chung Hsu, Taichung, both of Taiwan

[73] Assignee: United Microelectronics Corp., Hsinchu, Taiwan

[21] Appl. No.: 370,617

[22] Filed: Jan. 10, 1995

[51] Int. Cl.⁶ ............................................. H01C 21/8234
[52] U.S. Cl. .................. 437/35; 437/44; 437/69; 257/344
[58] Field of Search ................ 437/35, 44, 69; 257/344

[56] References Cited

U.S. PATENT DOCUMENTS

| | | | |
|---|---|---|---|
| 5,100,820 | 3/1992 | Tsubone | 437/44 |
| 5,254,494 | 10/1993 | Van Der Plas et al. | 437/69 |
| 5,292,673 | 3/1994 | Shinriki et al. | 437/42 |
| 5,401,678 | 3/1995 | Jeong et al. | 437/44 |

FOREIGN PATENT DOCUMENTS 59-104167A  6/1584  Japan ................................. 437/44

*Primary Examiner*—George Fourson
*Assistant Examiner*—Richard A. Booth
*Attorney, Agent, or Firm*—Ladas & Parry

[57] ABSTRACT

The structural configuration of an improved submicron metal-oxide semiconductor field-effect transistor and the method of its fabrication are disclosed. A field oxidation procedure is employed to increase the thickness of the gate oxide layer at both of its ends. The result is decreased gate and drain overlapping region parasitic capacitance, as well as decreased gate-induced drain-leakage current, due to the reduction of the electric field intensity in the overlapping region at which the thickness is increased. The resulting metal-oxide semiconductor field-effect transistor, therefore, is provided with improved operating characteristics for use at high frequencies.

9 Claims, 4 Drawing Sheets

METAL-OXIDE-SEMICONDUCTOR FIELD-EFFECT TRANSISTOR AND ITS METHOD OF FABRICATION

BACKGROUND OF THE INVENTION

1. Field of the Invention

The present invention relates in general to a metal-oxide-semiconductor field-effect transistor (MOSFET). In particular, the present invention relates to an improved MOSFET and its method of fabrication, with the MOSFET having reduced parasitic capacitance in the overlapped area of the gate and drain regions, as well as suppressed gate-induced drain-leakage (GIDL) current.

2. Technical Background

As the trend of integrated circuits miniaturization continues to push the semiconductor fabrication process deeper into submicron resolution, the direct result of this reduction in the dimension of the structural configuration is a change in the device characteristics.

For example, FIG. 1 depicts a cross-sectional view of a conventional MOSFET, which is utilized for the purpose of the description of the present invention. As seen in the drawing, in the conventional MOSFET, a gate oxide layer 10 is first formed on a P-type semiconductor substrate 1. Then, a gate electrode 12 is formed on the top of the gate oxide layer 10. A pair of N-type lightly-doped (N−) drain/source regions 100 are formed in the P-type substrate 1 on either side of the gate oxide layer 10. Another pair of N-type heavily-doped (N+) drain/source regions 102 are further formed adjacent to the N-type lightly-doped (N+) drain/source regions 100. The outer edge of the lightly-doped (N−) each drain/source region 100 is adjacent the inner edge of the neighboring heavily-doped (N+) drain/source region 102, as can be seen in FIG. 1.

The reduction in the thickness of the gate oxide layer, as a consequence of submicron fabrication processes, would lead directly to an increase of the parasitic capacitance in the overlapping region of the gate and drain regions of the MOSFET device, since the distance between the gate and drain regions is also reduced to a scale of about several hundred Å (10−8 cm).

As a result of the increasing parasitic capacitance in the overlapping gate and drain regions, the maximum frequency of the MOSFET semiconductor device is restricted, thereby limiting the application of such MOSFET devices in such areas as analog common source amplifiers as well as in high speed digital.

Moreover, the reduction of the dimension of the gate oxide layer also results in an increase in the electric field intensity in the region where the gate and drain overlap. This intensified electric field increases the leakage current produced as a result of the gate-induced drain-leakage effect. As a result of the reduced thickness of the gate oxide layer, the gate induced drain leakage effect induces band-to-band tunneling and causes a leakage current to flow from the gate of the MOSFET to the depletion region in the gate and drain overlapping region.

Therefore, in the art of fabrication of MOSFET semiconductor devices, efforts have been concentrated on issues including reduction of parasitic capacitance in the gate and drain overlapping region, as well as the reduction of the electric field intensity generated in the gate and drain overlapping region.

SUMMARY OF THE INVENTION

It is therefore an object of the present invention to provide an improved structural configuration for MOSFET devices and its method of fabrication capable of simultaneous reduction of the parasitic capacitance and the electric field intensity by increasing the thickness of the gate oxide layer directly above the gate and drain overlapping regions.

The present invention achieves the above indicated objects by providing an improved submicron metal-oxide semiconductor field-effect transistor and the process for its fabrication. A field oxidation procedure is employed to increase the thickness of the gate oxide layer at both of its ends. The result is a decrease in the gate and drain overlapping region parasitic capacitance, as well as a decrease in the gate-induced drain-leakage current, due to the reduction of the electric field intensity in the overlapping region when the thickness is increased. The resulting metal-oxide semiconductor field-effect transistor therefore has improved operating characteristics for use in high frequency applications.

BRIEF DESCRIPTION OF THE DRAWING

Other objects, features and advantages of the present invention will become apparent by way of the following detailed description of the preferred but non-limiting embodiment. The description is made with reference to the accompanied drawings, wherein.

DETAILED DESCRIPTION OF THE PREFERRED EMBODIMENT

Reference is now made to FIGS. 2a–2f which are a series of cross-sectional views of the improved MOSFET semiconductor depicting the device in different stages of fabrication.

Stage 1

Figure 1:
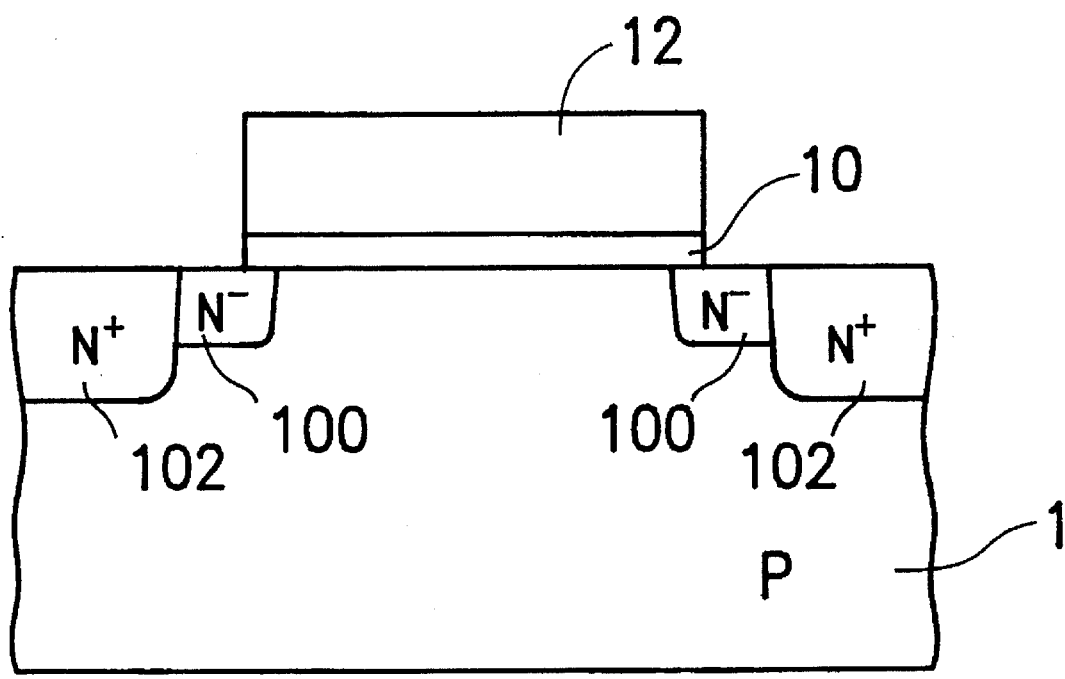
FIG. 1 schematically shows the cross section of the structural configuration of a conventional MOSFET.
Figure 2A:
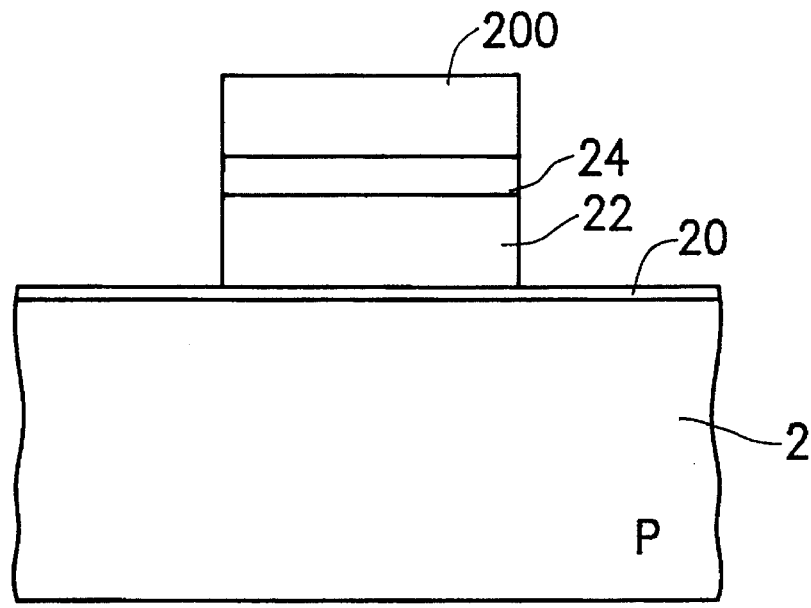
FIGS. 2a–2f schematically show the cross-sectional views of the structural configuration of the improved MOSFET of the present invention as selected from the process stages of its fabrication for the description of the present invention.

Referring to FIG. 2a, a P-type silicon substrate 2 is preferably subjected to an oxidation process to form a layer of oxide 20 having a thickness between 100–200 Å. Chemical vapor deposition procedures are then performed to deposit a polysilicon layer 22 and a mask layer 24, such as, nitride. The thickness of the polysilicon layer 22 is preferably in the range between 1,000–4,000 Å, while the thickness of the mask layer 24 is preferably between 500–3,000 Å. Thereafter, a photolithography procedure is performed to define the component channel, by forming a photomask layer 200. The photomask layer 200 is used for the removal of the portions of the polysilicon layer 22 and the mask layer 24 that are not covered by the photomask layer 200, thereby exposing the oxide layer 20, using techniques well know in the art.

Stage 2

Figure 2B:
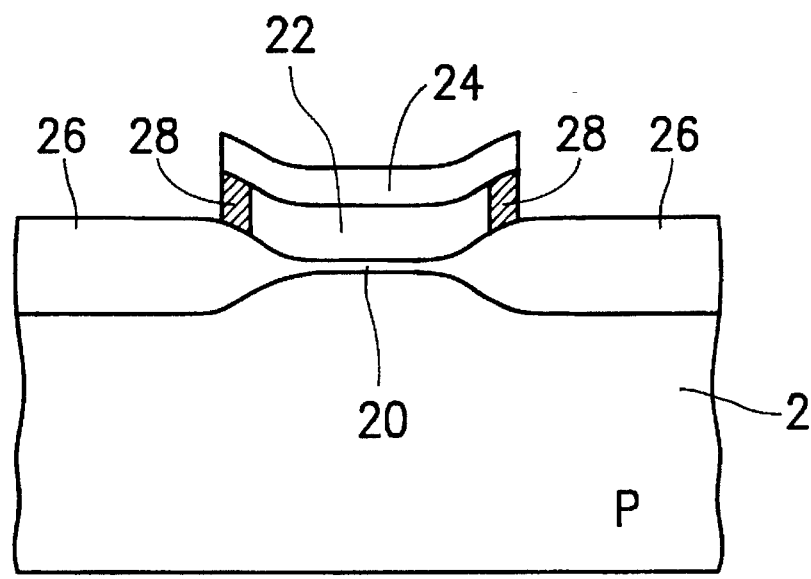

Referring next to FIG. 2b, the photomask layer 200 in FIG. 2a is then removed. A partial oxidation procedure is then performed on the exposed surface of the oxide layer 20 and the sidewalls of the polysilicon layer 22. A field oxide layer 26 (on the exposed oxide layer 20), as well as the oxides of the polysilicon 28 are formed as a result of this oxidation procedure, as is shown in FIG. 2b. During this partial oxidation procedure, the portion of the oxide layer 20 under both side edges of the polysilicon layer 22 will also be oxidized, forming bird's beak-shaped field oxide layers 26, which raise the two side edges of both the polysilicon layer 22 and the mask layer 24. The thickness of the field oxide layer 26 is preferably between 1,000–6,000 Å.

Stage 3

Figure 2C:
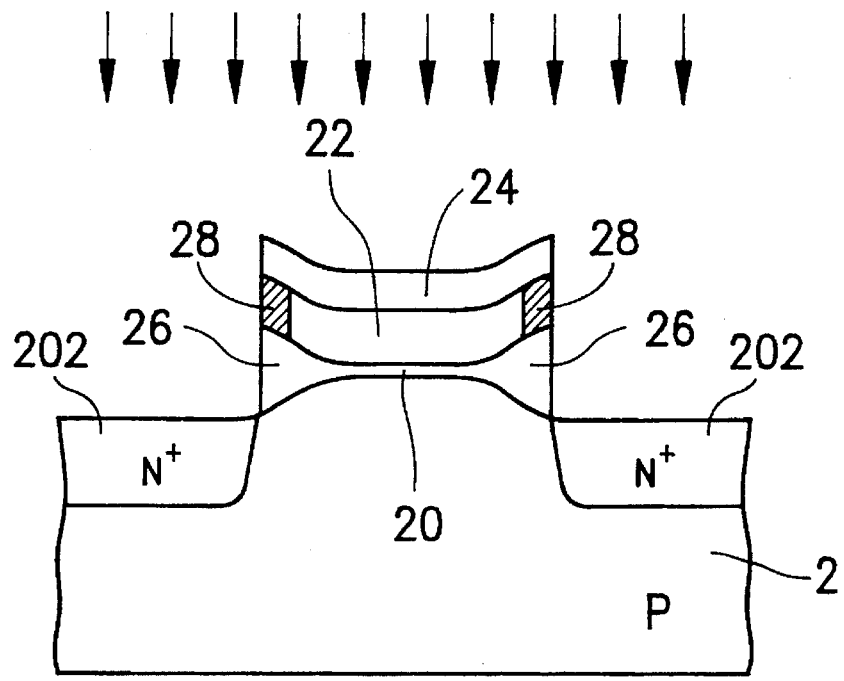

Turning next to FIG. 2c, mask layer 24 is utilized as a masking layer during an etching procedure which removes the exposed portions of the field oxide layer 26 (i.e. those portion outside of the coverage afforded at this stage by the polysilicon layer 22), the mask layer 24, as well as the oxide layer 28 of the polysilicon layer 22 on the two sidewalls. Reactive ion etching (RIE) is preferably used as the etching agent.

With the field oxide layer 26 removed, as described above, the surface of the P-type substrate 2 is again exposed. This exposed P-type substrate 2 can then be subjected to a N-type impurity implantation procedure that implants preferably arsenic, or other impurities, such as phosphorus, etc. This N-type impurity implantation procedure preferably employs the mask layer 24 as a mask so that self-alignment is achieved. The result of this impurity implantation procedure is as shown in this figure by N-type heavily-doped drain/source regions 202. A typical N-type impurity implantation energy employed in this embodiment is about 50 keV, and the impurity dose is about $2 \times 10^{15}$ atoms/cm$^2$, when the preferably implanted impurity material is arsenic.

Stage 4

Figure 2D:
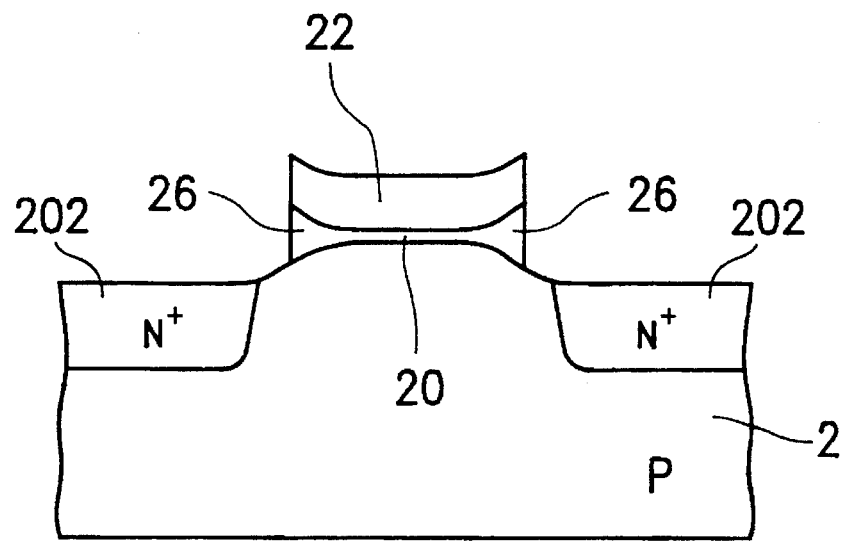

Referring now to FIG. 2d, the mask layer 24 is removed by, for example, a hot phosphoric acid solution, if the mask layer 24 is a silicon nitride layer. Now, the polysilicon layer 22 is utilized as the mask in the process of removing the oxide layer 28 formed on the sides of the polysilicon layer 22 and the underlying portions of the field oxide layer 26 that are not covered by the polysilicon layer 22. The process of removal of the field oxide layer 26, as well as the oxide layer of the polysilicon 28, can be performed simultaneously, since they are all silicon oxides, and can be processed by the same etching procedure, preferably by a diluted HF solution.

Stage 5

Figure 2E:
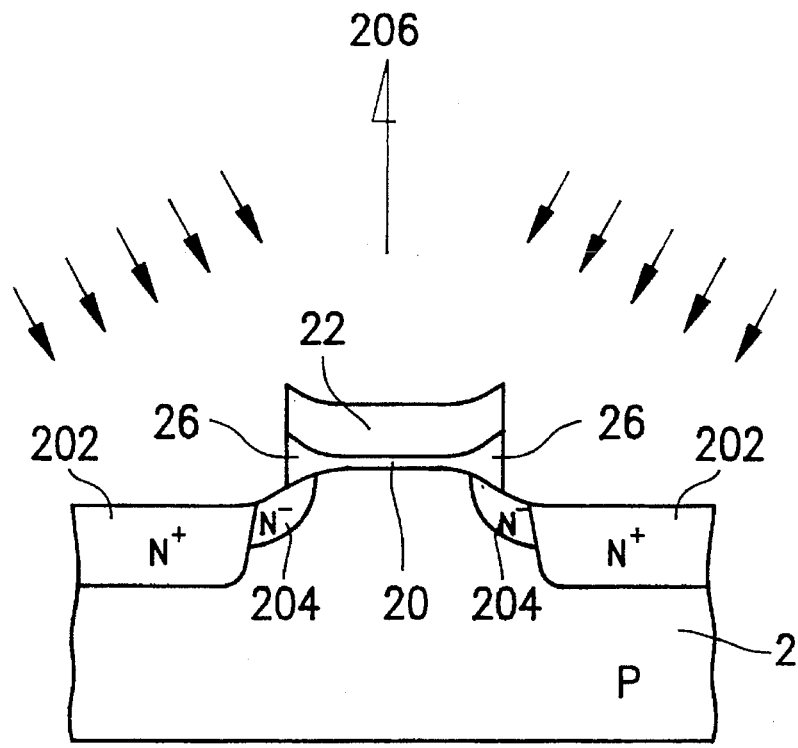

As can be seen by reference to FIG. 2e, polysilicon layer 22 is utilized as a self-aligning masking layer during the implantation of N-type impurities such as, for example, phosphorus or arsenic impurities into the P-type silicon substrate 2. N-type lightly-doped (N-) drain/source regions 204 are formed as a result in the substrate 2. Each N-type lightly-doped drain/source region 204 spreads under the bird's beak region 26 of the field oxide layer. This can be done by performing the implantation at, for example, a large angle, ranging from about 30 to about 60 degrees relative to the vertical (see vertical arrow 206). The N-type lightly-doped (N-) drain/source regions 204 are in contact with the inner side of the N-type heavily-doped drain/source region 202. The N-type impurity implantation procedure previously described can be conducted at an implantation energy of 30 keV. The impurity dose is about $2 \times 10^{13}$ atoms/cm2, and the impurity used is preferably phosphorus. Polysilicon layer 22 is also implanted at this time.

Figure 2F:
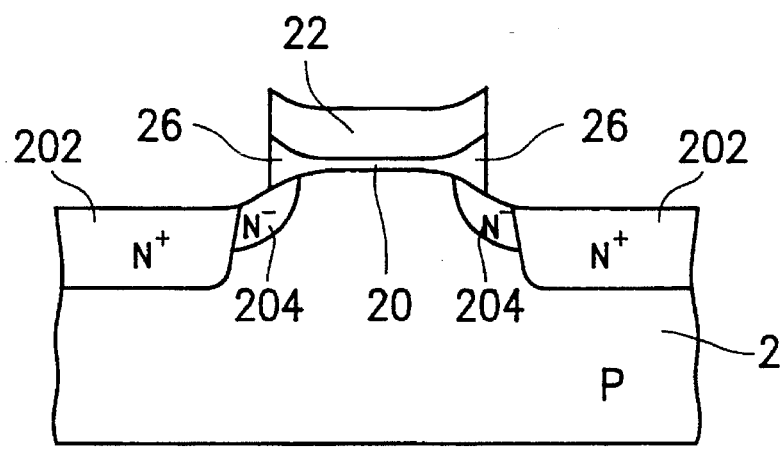

FIG. 2f exemplifies a preferred embodiment of the MOSFET of the present invention. The MOSFET has a gate electrode formed by polysilicon layer 22. The MOSFET also has a relatively thick field oxide layer 26 which decreases in thickness down to the thickness of a thinner oxide layer 20, which two layers together constitute a gate oxide layer located under polysilicon layer 22. The N-type lightly-doped (N-) drain/source regions 204 are located underneath the field oxide layer 26 reaching a majority of the distance up the sloping portion underneath the bird's beak oxide 26, in the P-type substrate 2. The MOSFET also comprises N-type heavily-doped (N+) drain/source regions 202 located next to the outer sides edges of the N-type lightly-doped (N-) drain/source regions 204, such as is the case as shown in FIG. 2e.

One important reason for configuring the N-type lightly-doped (N-) drain/source regions 204 underneath the field oxide layer 26 is simply because this arrangement can prevent the region of the field oxide layer 26 from generating parasitic resistance. The presence of the N-type lightly-doped (N-) drain/source regions 204 function to reduce the parasitic capacitance that arises from the thickness of the field oxide layer 26.

The above-described preferred embodiment of the present invention is utilized only for the purpose of the description of the present invention. Persons skilled in this art can appreciate the fact that other similar arrangements can be devised from the embodiments disclosed above without departing from the spirit of the present invention, which is recited in the claims that follow.

What id claimed is:

1. A process for fabricating a metal-oxide semiconductor field-effect transistor on a semiconductor substrate, comprising the steps of:

forming an oxide layer on said semiconductor substrate;

sequentially forming a polysilicon layer and a mask layer on said oxide layer to form a channel mask;

utilizing said mask layer as a mask in forming field oxide layers at opposite ends of said channel mask by oxidizing said oxide layer, wherein each of said field oxide layers encroach into the region under a side edge of said mask layer and wherein oxides of polysilicon are formed on sidewalls of said polysilicon layer;

removing those portions of said field oxide layers not covered by said mask layer;

utilizing said mask layer as masking while implanting impurities into said substrate to thereby form heavily-doped drain/source regions;

removing said mask layer;

removing said oxide of polysilicon and portions of said field oxide layer not covered by said polysilicon layer; and utilizing said polysilicon layer as masking while implanting impurities into said substrate to thereby form lightly-doped drain/source regions beneath said field oxide layers.

2. The process for fabricating the metal-oxide semiconductor field-effect transistor of claim 1, wherein the step of forming said channel mask comprises subsequently forming a polysilicon layer and a mask layer on said oxide layer, followed by patterning and etching.

3. The process for fabricating the metal-oxide semiconductor field-effect transistor of claim 2, wherein said mask layer is silicon nitride.

4. The process for fabricating the metal-oxide semiconductor field-effect transistor of claim 3, wherein said silicon nitride is removed by a phosphoric acid solution.

5. The process for fabricating the metal-oxide semiconductor field-effect transistor of claim 1, wherein the implantation energy for forming said heavily-doped drain/source region is about 50 keV, the impurity dose is about $2 \times 10^{15}$ atoms/cm2, and the impurity is arsenic.

6. The process for fabricating the metal-oxide semiconductor field-effect transistor of claim 5, wherein the implanting energy for forming said lightly-doped drain/source region is about 30 keV, the impurity dose is about $2\times10^{13}$ atoms/cm$^2$, and the impurity is phosphorus.

7. The process for fabricating the metal-oxide semiconductor field-effect transistor of claim 2, wherein said implantation for forming said lightly-doped drain/source regions is at a large angle implantation, ranging from about 30 to about 60 degrees relative to a line perpendicular said semiconductor substrate.

8. The process for fabricating metal-oxide semiconductor field-effect transistor of claim 5, wherein the thickness of said oxide layer is about 100–200 Å.

9. The process for fabricating metal-oxide semiconductor field-effect transistor of claims 5, wherein the thickness of said field oxide layers is about 1,000–6,000 Å.

* * * * *